(12) United States Patent
Sung et al.

(10) Patent No.: US 12,284,843 B2
(45) Date of Patent: Apr. 22, 2025

(54) SEMICONDUCTOR LIGHT EMITTING DEVICE PACKAGE INCLUDING REFLECTIVE ELECTRODE PATTERN

(71) Applicant: SAMSUNG ELECTRONICS CO., LTD., Suwon-si (KR)

(72) Inventors: Youngkyu Sung, Hwaseong-si (KR); Dooho Jeong, Hwaseong-si (KR); Myunggoo Cheong, Suwon-si (KR); Seungwan Chae, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 458 days.

(21) Appl. No.: 17/569,028

(22) Filed: Jan. 5, 2022

(65) Prior Publication Data
US 2022/0320370 A1 Oct. 6, 2022

(30) Foreign Application Priority Data

Mar. 31, 2021 (KR) .......................... 10-2021-0041577

(51) Int. Cl.
*H01L 33/24* (2010.01)
*H01L 33/22* (2010.01)
(Continued)

(52) U.S. Cl.
CPC .......... *H10H 20/821* (2025.01); *H10H 20/82* (2025.01); *H10H 20/856* (2025.01);
(Continued)

(58) Field of Classification Search
CPC ......... H01L 33/24; H01L 33/08; H01L 33/46; H01L 33/405; H01L 33/60; H01L 27/15
See application file for complete search history.

(56) References Cited

U.S. PATENT DOCUMENTS 9,851,056 B2 12/2017 Kim et al.
10,505,073 B2 12/2019 Sung et al.
(Continued)

FOREIGN PATENT DOCUMENTS

CN 110223999 A * 9/2019 ............. H01L 27/15
KR 1020200069975 A 6/2020

*Primary Examiner* — Walter H Swanson
*Assistant Examiner* — Moataz Khalifa
(74) *Attorney, Agent, or Firm* — Sughrue Mion, PLLC

(57) ABSTRACT

A semiconductor light emitting device package includes: a substrate; a first semiconductor layer including first regions including a first-type semiconductor material and having a first height, and a second region disposed between the first regions and having a second height lower than the first height; an active layer including disposed in the first regions, and emitting light of a predetermined wavelength band; a second semiconductor layer disposed on the active layer and formed of a second-type semiconductor material; a third semiconductor layer disposed on the second semiconductor layer, and formed of a second-type semiconductor material different from the second-type semiconductor material of the second semiconductor layer; a transparent electrode layer including disposed on the third semiconductor layer; and a reflective electrode layer electrically connected to the transparent electrode layer, respectively, and including portions overlapping the active layer in a vertical direction and a horizontal direction, respectively.

20 Claims, 13 Drawing Sheets

(51) Int. Cl.
*H01L 33/60* (2010.01)
*H01L 33/62* (2010.01)
*H10H 20/82* (2025.01)
*H10H 20/821* (2025.01)
*H10H 20/856* (2025.01)
*H10H 20/857* (2025.01)
*H10H 29/10* (2025.01)
*H10H 20/01* (2025.01)
*H10H 20/825* (2025.01)
*H10H 20/833* (2025.01)

(52) U.S. Cl.
CPC .......... *H10H 20/857* (2025.01); *H10H 29/10* (2025.01); *H10H 20/0363* (2025.01); *H10H 20/0364* (2025.01); *H10H 20/825* (2025.01); *H10H 20/833* (2025.01)

(56) References Cited

U.S. PATENT DOCUMENTS

| | | |
|---|---|---|
| 10,580,929 B2 | 3/2020 | Won Cheol |
| 10,763,399 B2* | 9/2020 | Lee .......................... H01L 33/50 |
| 2016/0155901 A1* | 6/2016 | Lopez ................... H01L 33/405 |
| | | 257/13 |
| 2017/0108173 A1 | 4/2017 | Kim et al. |
| 2017/0288088 A1 | 10/2017 | Won Cheol |
| 2018/0182931 A1 | 6/2018 | Lee et al. |
| 2018/0198022 A1 | 7/2018 | Sung et al. |
| 2020/0020739 A1* | 1/2020 | Chen ....................... H01L 33/24 |
| 2020/0220049 A1 | 7/2020 | Oh et al. |

* cited by examiner

SEMICONDUCTOR LIGHT EMITTING DEVICE PACKAGE INCLUDING REFLECTIVE ELECTRODE PATTERN

CROSS-REFERENCE TO RELATED APPLICATION

This application claims priority from Korean Patent Application No. 10-2021-00415772, filed on Mar. 31, 2021, in the Korean Intellectual Property Office, the disclosure of which is incorporated herein by reference in its entirety.

BACKGROUND

1. Field

Apparatuses and methods consistent with the embodiments of the disclosure relate to a semiconductor light emitting device package and a method for manufacturing the same.

2. Description of the Related Art

A semiconductor light emitting device is known as a next-generation light source having advantages of long lifespan, low power consumption, rapid response speed, environmental friendliness, etc., and is highlighted as an important light source in various products such as a lighting device, a display device, etc. In particular, a light emitting device based on a group III nitride such as GaN, AlGaN, InGaN, InAlGaN, etc. functions as a semiconductor light emitting device outputting blue light or ultraviolet light.

SUMMARY

The embodiments of the disclosure provide a semiconductor light emitting device package manufactured to minimize a loss rate of light emitted from a semiconductor light emitting device.

According to an embodiment of the disclosure, a semiconductor light emitting device package may include: a substrate; a first semiconductor layer including first regions including a first-type semiconductor material and having a first height, and a second region disposed between the first regions and having a second height lower than the first height; an active layer including a plurality of patterns disposed in the first regions of the first semiconductor layer, respectively, the plurality of patterns emitting light of a predetermined wavelength band; a second semiconductor layer including a plurality of patterns disposed on the patterns of the active layer, respectively, and formed of a second-type semiconductor material; a third semiconductor layer including a plurality of patterns disposed on the patterns of the second semiconductor layer, respectively, and formed of a second-type semiconductor material different from the second-type semiconductor material of the second semiconductor layer; a transparent electrode layer including a plurality of patterns disposed on the patterns of the third semiconductor layer, respectively; and a reflective electrode layer including a plurality of patterns electrically connected to the patterns of the transparent electrode layer, respectively, and including portions overlapping the patterns of the active layer in a vertical direction and a horizontal direction, respectively.

According to an embodiment of the disclosure, a semiconductor light emitting device package may include: a substrate including a light-emitting area and a non-light-emitting area; a light emitting device disposed on the substrate, and including an anode layer, an active layer, and a cathode layer; a transparent electrode layer electrically connected to the anode layer and disposed on the anode layer; and a reflective electrode layer electrically connected to the transparent electrode layer, the reflective electrode layer including a portion disposed on an upper portion of the transparent electrode layer and a side portion of the active layer, and a portion disposed in the non-light emitting area in which the light emitting device is not disposed.

According to an embodiment of the disclosure, a semiconductor light emitting device package may include: a substrate; a first semiconductor layer disposed on the substrate, and formed of a first-type semiconductor material, the first semiconductor layer including first regions having a first height, and a second region disposed between the first regions and having a second height smaller than the first height; an active layer including patterns disposed on the first regions of the semiconductor layer, respectively, the patterns emitting light of a predetermined wavelength band; a second semiconductor layer including a plurality of patterns disposed on the patterns of the active layer, respectively, and formed of a second-type semiconductor material; a third semiconductor layer including a plurality of patterns disposed on the patterns of the second semiconductor layer, respectively, and formed of a second-type semiconductor material different from the second-type semiconductor material of the second semiconductor layer; a transparent electrode layer including a plurality of patterns disposed on the patterns of the third semiconductor layer, respectively; a bonding electrode layer disposed on the second region of the first semiconductor layer; a first insulating layer disposed on the transparent electrode layer and the bonding electrode layer; a reflective electrode layer disposed on the first insulating layer, and including a plurality of patterns contacting the patterns of the transparent electrode layer, respectively; a second insulating layer disposed on the reflective electrode layer; and a pad electrode layer disposed on the second insulating layer, the pad electrode layer including a pattern contacting a part of the patterns of the reflective electrode layer, and a pattern contacting the bonding electrode layer, wherein each of the first regions includes a first inclined surface formed at one side portion of the first region connected to the substrate, a second inclined surface formed at the other side portion of the first region connected to the second region, and an upper surface disposed between the first inclined surface and the second inclined surface, and wherein a part of the patterns of the reflective electrode layer is formed to extend along the first inclined surface, the second inclined surface and the upper surface to a region where the first semiconductor layer is not disposed.

DETAILED DESCRIPTION OF EMBODIMENTS

The embodiments described herein are all example embodiments, and thus, the inventive concept is not limited thereto and may be realized in various other forms. Each of the embodiments provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof. In addition, it should be understood that all descriptions of principles, aspects, examples, and specific embodiments of the inventive concept are intended to encompass structural and functional equivalents thereof.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1:
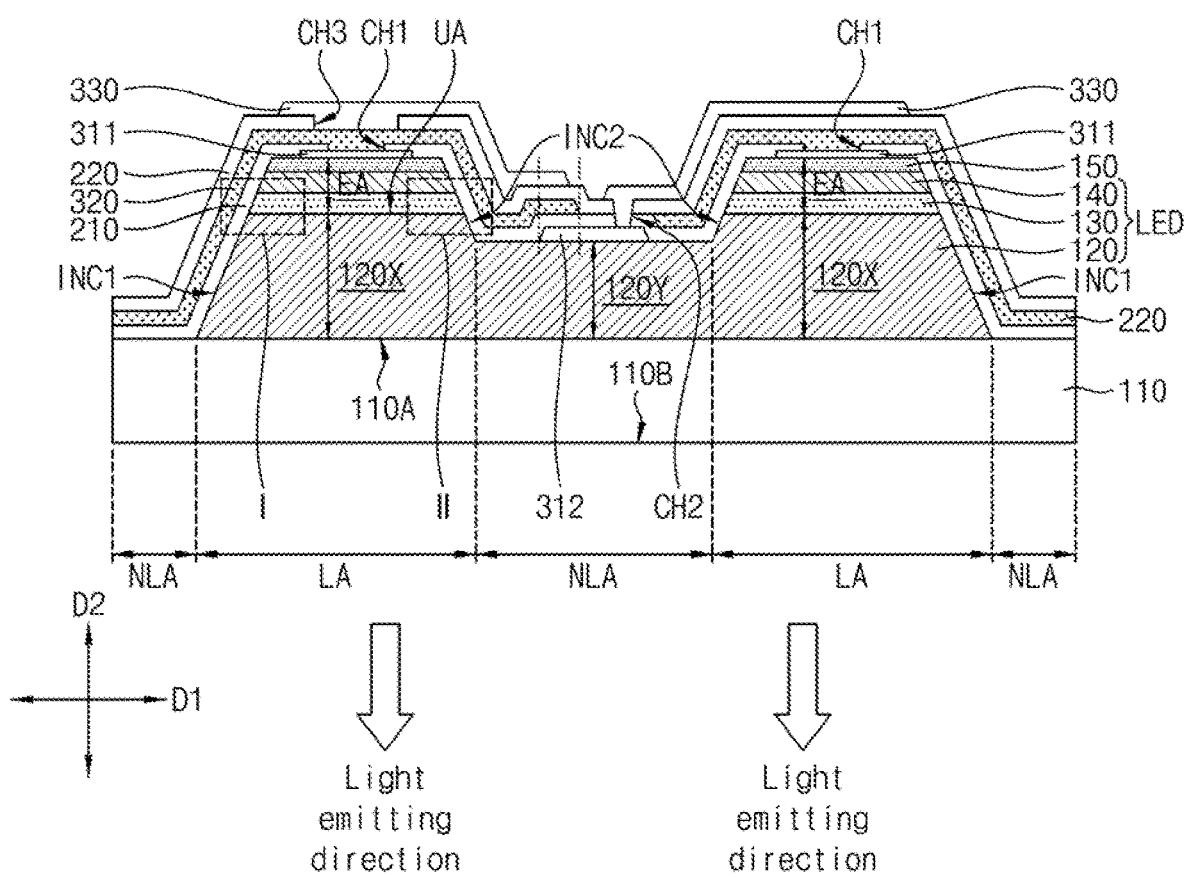
FIG. 1 is a view showing a semiconductor device package according to an embodiment of the disclosure.
Figure 2A:
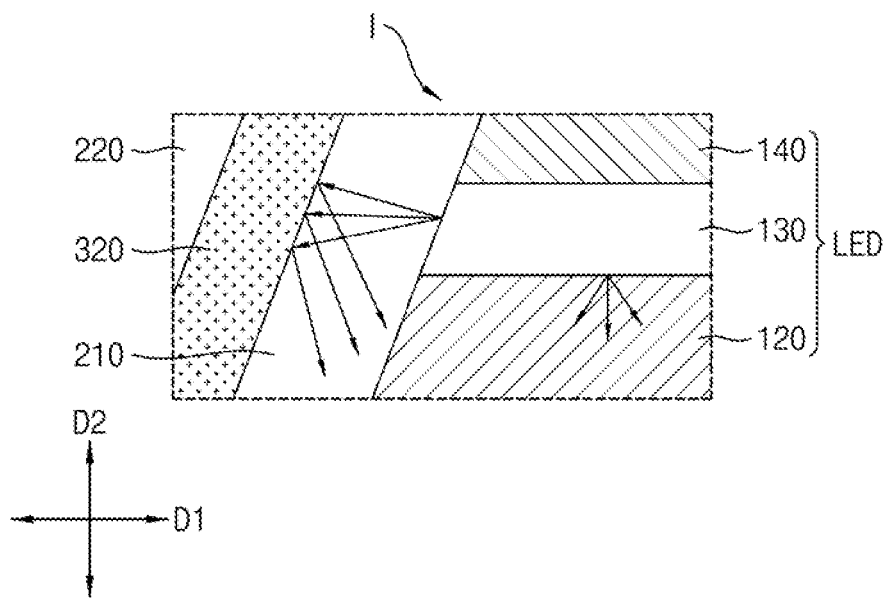
FIGS. 2A and 2B are enlarged views of portions I and II of FIG. 1, respectively.
Figure 2B:
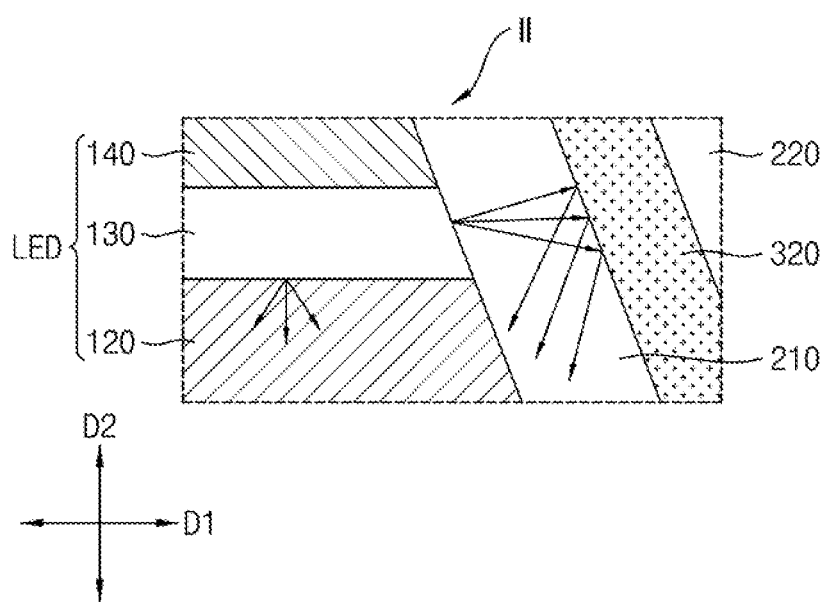

FIG. 1 is a view showing a semiconductor device package according to an embodiment of the disclosure. FIGS. 2A and 2B are enlarged views of portions I and II of FIG. 1, respectively.

Referring to FIGS. 1, 2A and 2B, a semiconductor light emitting device package 1 may emit light substantially advancing in one direction (for example, a light emitting direction in FIG. 1).

In an embodiment, the semiconductor light emitting device package 1 may include at least one light-emitting area LA and a non-light-emitting area NLA. Each light-emitting area LA may be defined as an area emitting light of a predetermined wavelength band. For example, an active layer 130 may be disposed in each light-emitting area LA. Light-emitting areas LA may include pixels, respectively, such that one pixel corresponds to each light-emitting area LA. The non-light-emitting area LNA may include an area dividing the light-emitting areas LA from each other. The non-light-emitting area LNA may be a pixel defining area. A plurality of circuit wirings to transfer an electrical signal to light emitting devices LED may be included in the non-light-emitting areas NLA.

In an embodiment, the semiconductor light emitting device package 1 may include a substrate 110, a first semiconductor layer 120, an active layer 130, a second semiconductor layer 140, a third semiconductor layer 150, a transparent electrode layer 311, a bonding electrode layer 312, a reflective electrode layer 320, a pad electrode layer 330, and a plurality of insulating layers 210 and 220.

The substrate 110 may be an insulating substrate, a conductive substrate, or a semiconductor substrate. In an embodiment, the substrate 110 may be a transparent substrate. For example, the substrate 110 may include sapphire, SiC, Si, $MgAl_2O_4$, MgO, $LiAlO_2$, $LiGaO_2$, or GaN.

The substrate 110 may include a first surface 110A at which a light emitting device LED is disposed, and a second surface 110B which is a surface opposite to the first surface 110A. The light emitting device LED may be disposed on the first surface 110A. An optical path of light emitted from the light emitting device LED may be configured to pass through the second surface 110B while extending from the first surface 110A. In an embodiment, the second surface 110B may be a flat surface. In accordance with embodiments, the first surface 110A may be a surface having a flat or bent shape.

The light-emitting area LA and the non-light-emitting area NLA described above may be defined at the substrate 110.

The first semiconductor layer 120 may be disposed on the first surface 110A of the substrate 110. In accordance with embodiments, a buffer layer (not shown) may be disposed on the substrate 110, and the first semiconductor layer 120 may be disposed on the buffer layer. In this case, the buffer layer may be $In_xAl_yGa_{1-x-y}N$ ($0 \leq x \leq 1$ and $0 \leq y \leq 1$), and may include GaN, AlGaN or InGaN undoped with an n-type or p-type impurity.

In an embodiment, the first semiconductor layer 120 may include a first-type semiconductor material. For example, the first type may be n type or p type. For example, the first semiconductor layer 120 may include a nitride semiconductor satisfying n-type $In_xAl_yGa_{1-x-y}N$ ($0 \leq x < 1$, $0 \leq y < 1$, and $0 \leq x+y < 1$). Here, an n-type impurity may include Si, Ge, Se, Te, or the like.

The first semiconductor layer 120 may include regions having different heights (thicknesses). The first semiconductor layer 120 may have an uneven structure when viewed in cross-section. In this case, the height of the first semiconductor layer 120 may be measured with reference to the first surface 110A or the second surface 110B of the substrate 110. In an embodiment, the first semiconductor layer 120 may include a plurality of first regions 120X having an average height (a first height) greater than a predetermined reference value, and a second region 120Y having an average height (a second height smaller than the first height) smaller than the predetermined reference value. The second region 120Y may be disposed between the plurality of first regions 120X. One first region 120X, the second region 120Y, and another first region 120X may be continuously disposed in a first direction D1. In accordance with embodiments, the first direction D1 may mean a horizontal direction.

Each first region 120X may substantially overlap each light-emitting area LA in a second direction D2. In the specification, the second direction D2 may be a direction intersecting the first direction D1, and may mean a vertical direction or a thickness direction in accordance with embodiments. The second region 120Y may overlap the non-light-emitting area NLA. Each first region 120X may include a first inclined surface INC1 disposed at one side and a second inclined surface INC2 disposed at the other side. In an embodiment, each first inclined surface INC1 may constitute a side surface of the first semiconductor layer 120. In an embodiment, each first inclined surface INC1 may contact the substrate 110 (or the buffer layer (not shown)) at an edge (an end) thereof. Each second inclined surface INC2 may contact the second region 120Y at an edge (an end) thereof.

The first inclined surface INC1 may be an inclined surface formed in accordance with a height difference between the first region 120X of the first semiconductor layer 120 and the first surface 110A of the substrate 110. The second inclined surface INC2 may be an inclined surface formed in accordance with a height difference between the first region 120X and the second region 120Y. The length of the first inclined surface INC1 may be greater than the length of the second inclined surface INC2. In accordance with embodiments, a part of the first regions 120X may be configured such that the first inclined surface INC1 and the second inclined surface INC2 thereof may contact different second regions 120Y, respectively. The first region 120X may further include an upper surface UA disposed between the first inclined surface INC1 and the second inclined surface INC2. In an embodiment, the upper surface UA of the first region 120X may be flat.

A part of the first inclined surfaces INC1 may be a scribing lane formed adjacent to an end (an edge or a side portion) of the semiconductor light emitting device package 1.

The second region 120Y may be disposed between the second inclined surfaces INC2 of two first regions 120X adjacent to each other. The upper surface UA of the first semiconductor layer 120 may have a structure having a groove in the second region 120Y as the second region 120Y is disposed between the first regions 120X having a relatively greater height than the second region 120Y. That is, the upper surface UA of the first semiconductor layer 120 may have an uneven structure in which a protrusion (convex) is formed in the first region 120X and a groove (concave) is formed in the second region 120Y.

The active layer 130, which includes a plurality of patterns, may be disposed on the first semiconductor layer 120. In an embodiment, each pattern of the active layer 130 may be disposed on each first region 120X of the first semiconductor layer 120. For example, each pattern of the active layer 130 may be formed at the upper surface UA of each first region 120X of the first semiconductor layer 120. In accordance with embodiments, the active layer 130 may not be disposed on the second area 120Y of the first semiconductor layer 120. The position where the active layer 130 is formed may be higher than the height of the second region 120Y of the first semiconductor layer 120. Since the active layer 130 is disposed on the first region having a relatively greater height, the light collecting rate of the light emitting device LED may be increased. In addition, since the active layer 130 is disposed on the first region having a relatively greater height, light loss of the light emitting device LED may be reduced.

In an embodiment, the active layer 130 may be a multi-quantum well (MQW) structure in which a quantum well layer and a quantum barrier layer are alternately stacked. For example, the quantum well layer and the quantum barrier layer may be $In_xAl_yGa_{1-x-y}N$ ($0 \le x \le 1$, $0 \le y \le 1$, and $0 \le x+y \le 1$) of different compositions, respectively. In some embodiments, the quantum well layer may be $In_xGa_{1-x}N$ ($0 < x \le 1$), and the quantum barrier layer may be GaN or AlGaN.

The second semiconductor layer 140, which includes a plurality of patterns, may be disposed on the active layer 130. In an embodiment, each pattern of the second semiconductor layer 140 may be disposed on each pattern of the active layer 130. The patterns of the second semiconductor layer 140 may overlap the first regions 120X of the first semiconductor layer 120 in the second direction D2, respectively.

In an embodiment, the second semiconductor layer 140 may include a second-type semiconductor material. For example, the second type may be different from the first type. For example, the second semiconductor layer 140 may include a nitride semiconductor satisfying p-type $In_xAl_yGa_{1-x-y}N$ ($0 \le x < 1$, $0 \le y < 1$, and $0 \le x+y < 1$). Here, a p-type impurity may include Mg, Zn, Be, or the like.

The first semiconductor layer 120, the active layer 130 and the second semiconductor layer 140 may constitute a light emitting device LED. For example, the light emitting device LED may be a light emitting diode. In an embodiment, the first semiconductor layer 120 may include a material having a low work function. The first semiconductor layer 120 may be a cathode of a light emitting diode. The active layer 130 may be a light emitting layer of the light emitting diode. The second semiconductor layer 140 may include a material having a high work function. In an embodiment, the second semiconductor layer 140 may be an anode of the light emitting diode. In an embodiment, the second semiconductor layer 140 may be a pixel semiconductor disposed at each pixel. In accordance with embodiments, the first semiconductor layer 120 may be configured to be an anode, the second semiconductor layer 140 may be configured to be a cathode.

When the light emitting device LED is activated, the light emitting device LED may emit light in several directions including the first direction D1 and the second direction D2. In an embodiment, the light emitting device LED (for example, the active layer 130 included in the light emitting device LED) may emit light of an ultraviolet wavelength band. For example, the ultraviolet wavelength band may be a band of about 10 to 380 nm or less. In addition, the ultraviolet wavelength band may be one of wavelength bands of ultraviolet (UV)-C, UV-B, UV-A, and extreme UV of 100 nm or less. In another embodiment, the active layer 130 may emit light of a visible wavelength band. For example, the visible wavelength band may be about 380 to 780 nm. In another embodiment, the active layer 130 may emit light of an infrared wavelength band. For example, the infrared wavelength band may be about 780 to 1,200 nm.

The third semiconductor layer 150, which includes a plurality of patterns, may be disposed on the second semiconductor layer 140. In an embodiment, each pattern of the third semiconductor layer 150 may overlap each first region 120X of the first semiconductor layer 120. For example, each pattern of the third semiconductor layer 150 may be disposed on each pattern of the second semiconductor layer 140.

In an embodiment, the third semiconductor layer 150 may be of the same type as the second semiconductor layer 140 (for example, the second type). For example, the third semiconductor layer 150 may of the second type (for example, the p type). Meanwhile, the third semiconductor layer 150 may include a material different from that of the second semiconductor layer 140. In an embodiment, the third semiconductor layer 150 may include a nitride semiconductor satisfying p-type $Ga_xN$. Here, a p-type impurity may include Mg, Zn, Be, or the like.

In accordance with an embodiment, the first semiconductor layer 120, the active layer 130, the second semiconductor layer 140, and the third semiconductor layer 150 may constitute a light emitting device LED. In this embodiment, both the second semiconductor layer 140 and the third semiconductor layer 150 may constitute an anode of the light emitting device LED. In this case, each pattern of the transparent electrode layer 311 may be disposed on the anode.

The active layer 130, the second semiconductor layer 140 and the third semiconductor layer 150 may constitute an expansion area EA having an increased height from the first region 120X of the first semiconductor layer 120. The expansion area EA may constitute the first inclined surface INC1 and the second inclined surface INC2, together with the first region 120X.

The transparent electrode layer 311, which includes a plurality of patterns, may be disposed on the third semiconductor layer 150. Each pattern of the transparent electrode layer 311 may overlap each first region 120X of the first semiconductor layer 120. For example, each pattern of the transparent layer 311 may be disposed on each pattern of the third semiconductor layer 150.

For example, the transparent electrode layer 311 may include ITO, ZnO, ZITO, ZIO, ZGO, ZTO, GTO, ZT, AZO, or the like. The transparent electrode layer 311 may have a predetermined area and a predetermined thickness in order to function as a bonding electrode to the third semiconductor layer 150 while minimizing absorption of light emitted from the light emitting device LED.

Each pattern of the active layer 130, each pattern of the second semiconductor layer 140, each pattern of the third semiconductor layer 150, and each pattern of the transparent electrode layer 311 may be sequentially disposed on the upper surface UA of each first region 120X of the first semiconductor layer 120.

Meanwhile, the bonding electrode layer 312, which includes at least one pattern, may be disposed in the second region 120Y of the first semiconductor layer 120. Each pattern of the bonding electrode layer 312 may contact the first semiconductor layer 120. Each pattern of the bonding electrode layer 312 may be disposed in the second region 120Y of the first semiconductor layer 120.

For example, the bonding electrode layer 312 may include at least one of Ag, Al, Ni, Ti, Cr, Cu, Au, Pd, Pt, Sn, W, Rh, Ir, Ru, Mg, Zn, and an alloy thereof. In accordance with embodiments, the bonding electrode layer 312 may include a reflective metal material.

The first insulating layer 210 may be disposed on the first semiconductor layer 120, the active layer 130, the second semiconductor layer 140, the third semiconductor layer 150, the transparent electrode layer 311, and the bonding electrode layer 312. In an embodiment, the first insulating layer 210 may cover all or part of an upper surface of each of the first semiconductor layer 120, the active layer 130, the second semiconductor layer 140, the third semiconductor layer 150, the transparent electrode layer 311, and the bonding electrode layer 312. For example, the first insulating layer 210 may be disposed on a side portion of the first region 120X of the first semiconductor layer 120, an upper portion of the second region 120Y of the first semiconductor layer 120, a side portion of each pattern of the active layer 130, a side portion of each pattern of the second semiconductor layer 140, upper and side portions of each pattern of the third semiconductor layer 150, side and upper portions of each pattern of the transparent electrode layer 311, and side and upper portions of each pattern of the bonding electrode layer 312.

In an embodiment, a first contact hole CH1 may be formed at the first insulating layer 210, to expose at least a part of the upper portion of each pattern of the transparent electrode layer 311. A second contact hole CH2 may be formed at the first insulating layer 210, to expose at least a part of the upper portion of each pattern of the bonding electrode layer 312.

In accordance with embodiments, the first insulating layer 210 may be disposed on the first semiconductor layer 120, the active layer 130, the second semiconductor layer 140, the third semiconductor layer 150, the transparent electrode layer 311 and the bonding electrode layer 312 while extending in the first direction D1 and may be formed on the first surface 110A of the substrate 110. That is, the first insulating layer 210 may also be formed on the substrate 110 in an area other than the area where the light emitting device LED is formed.

In an embodiment, the first insulating layer 210 may include an insulating material. For example, the insulating material may include silicon oxide, silicon oxynitride, silicon nitride, or other insulating materials. For example, the first insulating layer 210 may include $SiO_2$, SiN, $Al_2O_3$, HfO, $TiO_2$, or ZrO.

The reflective electrode layer 320, which includes a plurality of patterns, may be disposed on the first insulating layer 210. The reflective electrode layer 320 may be formed on the majority of the first insulating layer 210. For example, the reflective electrode layer 320 may also be formed on the first insulating layer 210 in an area (for example, an area in which the first semiconductor layer 120 is not disposed on the substrate 110) other than an area overlapping the first region 120X of the first semiconductor layer 120 and an area in which the light emitting device LED is formed on the substrate 110.

In an embodiment, each pattern of the reflective electrode layer 320 may be disposed on upper and side portions of each light emitting device LED. For example, each pattern of the reflective electrode layer 320 may be disposed on the first inclined surface INC1, the second inclined surface INC2, and the upper portion of each pattern of the third semiconductor layer 150. Each pattern of the reflective electrode layer 320 may be disposed on all of the first inclined surface INC1, the upper surface UA and the second inclined surface INC2 formed in the first region 120X of the first semiconductor layer 120 (in detail, an upper surface of the expansion area EA, and the first inclined surface INC1 and the second inclined surface INC2 formed by the expansion area EA and the first region 120X). A part of the patterns of the reflective electrode layer 320 may be formed to be disposed on the above-described scribing lane.

In an embodiment, each pattern of the reflective electrode layer 320 may extend in the first direction D1 along the second inclined surface INC2, and an extension portion thereof may overlap the second region 120Y of the first semiconductor layer 120. Each pattern of the reflective electrode layer 320 may include a portion disposed at the same level as the active layer 130, a portion disposed at a higher level than the active layer 130, and a portion disposed at a lower level than the active layer 130.

In an embodiment, a part of the patterns of the reflective electrode 320 may include a portion overlapping the bonding electrode layer 312 in the second direction D2. The part of the patterns of the reflective electrode layer 320 overlapping the bonding electrode layer 312 may also overlap the second region 120Y of the first semiconductor layer 120.

Meanwhile, the reflective electrode layer 320 may function to reflect light emitted from the light emitting device LED toward the substrate 110 as shown in FIGS. 2A and 2B. In particular, the reflective electrode layer 320 may change an optical path of light emitted from the light emitting device LED in the first direction D1 or in an upward direction (for example, a direction different from a direction from the active layer 130 toward the substrate 110) to a direction in which an optical path substantially passes through the substrate 110. Further, due to the disposition of the reflective electrode layer 320 in the second region 120Y as described above, light emitted from the light emitting device LED and reflected from the substrate 110 toward the bonding layer and therearound in second region 120Y may be reflected by the reflective electrode layer 320 toward the substrate 110 again. Accordingly, the reflective electrode layer 320 may maximize efficiency of light emitted from the light emitting device LED.

In an embodiment, at least a part of a pattern of the reflective electrode layer 320 may contact a part of the patterns of the transparent electrode layer 311 through the first contact hole CH1 formed at the first insulating layer 210. That is, the reflective electrode layer 320 may be electrically connected to the transparent electrode layer 311, and may be electrically connected to both the second semiconductor layer 140 and the third semiconductor layer 150 under predetermined conditions.

In an embodiment, the reflective electrode layer 320 may include a reflective metal material. The reflective metal material may include Ag, Al, Au, Rh, or an alloy thereof.

The second insulating layer 220 may be disposed on the reflective electrode layer 320. In an embodiment, the second insulating layer 220 may cover all or part of an upper surface of the reflective electrode layer 320. In an embodiment, the second insulating layer 220 may include a portion covering the reflective electrode layer 320 and extending in the first direction D1, thereby contacting the first insulating layer 210. At this portion, the second insulating layer 220 may be disposed on the first insulating layer 210. This portion may overlap the second region 120Y of the first semiconductor layer 120. The second insulating layer 220 may also be formed on the substrate 110 in a region other than the region in which the light emitting device LED is formed.

In an embodiment, a third contact hole CH3 may be formed at the second insulating layer 220, to expose at least a part of an upper portion in a part of a plurality of patterns of the reflective electrode layer 320. In addition, the second insulating layer 220 may also be formed with the second contact hole CH2 in a region where the second insulating layer 220 contacts the first insulating layer 210, to expose at least a part of the upper portion of each pattern of the bonding electrode layer 312, together with the first insulating layer 210. That is, at least a part of the upper portion of each pattern of the bonding electrode layer 312 may be exposed through the second contact hole CH2 formed at the first insulating layer 210 and the second insulating layer 220.

In an embodiment, the second insulating layer 220 may include an insulating material. For example, the insulating material may include silicon oxide, silicon oxynitride, silicon nitride, or other insulating materials. For example, the second insulating layer 220 may include $SiO_2$, SiN, $Al_2O_3$, HfO, $TiO_2$, or ZrO.

In an embodiment, respective ends of a part of the patterns of the first insulating layer 210, a part of the patterns of the reflective electrode layer 320, and a part of the patterns of the second insulating layer 220 may be aligned with an end of the substrate 110 in the second direction D2. Here, the end of the substrate 110 may be included in an area defined as the non-light-emitting area NLA.

The pad electrode layer 330, which includes a plurality of patterns, may be disposed on the second insulating layer 220. A pattern of the pad electrode layer 330 may fill the third contact hole CH3.

In an embodiment, a part of the patterns of the pad electrode layer 330 may contact a part of the patterns of the reflective electrode layer 320 through the third contact hole CH3. That is, the part of the patterns of the pad electrode layer 330 may be electrically connected to the part of the patterns of the reflective electrode layer 320 and a part of the patterns of the transparent electrode layer 311 contacting the part of the patterns of the reflective electrode layer 320, and may also be electrically connected to both the second semiconductor layer 140 and the third semiconductor layer 150 under predetermined conditions. In accordance with embodiments, the part of the patterns of the pad electrode layer 330 may extend in the first direction D1, and may overlap the bonding electrode layer 312 at a portion thereof (for example, in the second direction D2).

In addition, another part of the patterns of the pad electrode layer 330 may contact a part of the patterns of the bonding electrode layer 312 through the second contact hole CH2. That is, the other part of the patterns of the pad electrode layer 330 may be electrically connected to the part of the patterns of the bonding electrode layer 312, and may also be electrically connected to the first semiconductor layer 120 under predetermined conditions.

In accordance with embodiments, each pattern of the pad electrode layer 330 may be formed on the second inclined surface INC2. In addition, in accordance with embodiments, each pattern of the pad electrode layer 330 may not be disposed on the first inclined surface INC1.

For example, the pad electrode layer 330 may include at least one of Ag, Al, Ni, Ti, Cr, Cu, Au, Pd, Pt, Sn, W, Rh, Ir, Ru, Mg, Zn, and an alloy thereof. In accordance with embodiments, the pad electrode layer 330 may include a reflective metal material.

Hereinafter, a method for manufacturing a semiconductor light emitting device package will be described with reference to FIGS. 3 to 9.

FIGS. 3 to 9 are sectional views explaining a method for manufacturing a semiconductor light emitting device package in accordance with an embodiment of the disclosure.

It will be appreciated that, although operations of the method in FIGS. 3 to 9 are described as being sequentially executed in accordance with the order of the drawings, a part of the operations shown as being continuously executed may be simultaneously executed, the order of the operations may be changed, a part of the operations may be omitted, or another operation may be added between successive ones of the operations.

Figure 3A:
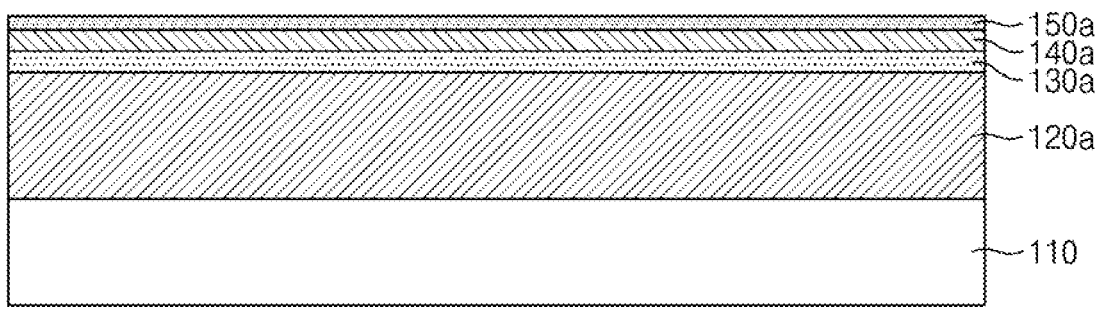
FIGS. 3A-3B to 9 are sectional views explaining a method for manufacturing a semiconductor light emitting device package in accordance with an embodiment of the disclosure.

Referring to FIG. 3A, a first semiconductor material 120a, an active material 130a, a second semiconductor material 140a, and a third semiconductor material 150a may be sequentially formed on a substrate 110. Here, the first semiconductor material 120a, the active material 130a, the second semiconductor material 140*a*, and the third semiconductor material 150*a* may include materials identical to materials constituting the first semiconductor layer 120, the active layer 130, the second semiconductor layer 140, and the third semiconductor layer 150 described above in reference to FIG. 1, respectively.

In an embodiment, the first semiconductor material 120*a*, the active material 130*a*, the second semiconductor material 140*a*, and the third semiconductor material 150*a* may be formed through epitaxial growth. For example, each of the first semiconductor material 120*a*, the active material 130*a*, the second semiconductor material 140*a*, and the third semiconductor material 150*a* may include a group III nitride-based semiconductor material.

Figure 3B:
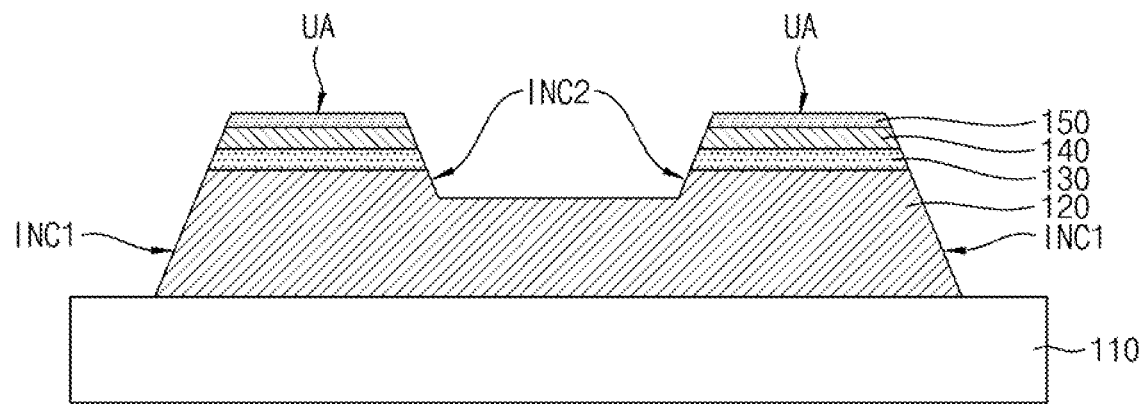

Referring to FIG. 3B, the first semiconductor material 120*a*, the active material 130*a*, the second semiconductor material 140*a*, and the third semiconductor material 150*a* may be removed at portions thereof, respectively, and may become the first semiconductor layer 120, each pattern of the active layer 130, each pattern of the second semiconductor layer 140, and each pattern of the third semiconductor layer 150, respectively. For example, the portions of the first semiconductor material 120*a*, the active material 130*a*, the second semiconductor material 140*a*, and the third semiconductor material 150*a* may be removed through dry etching or wet etching.

As the portions of the first semiconductor material 120*a*, the active material 130*a*, the second semiconductor material 140*a*, and the third semiconductor material 150*a* are removed, the first inclined surface INC1, the second inclined surface INC2 and the upper surface UA described in reference to FIG. 1 may be formed at the first semiconductor layer 120, each pattern of the active layer 130, each pattern of the second semiconductor layer 140, and each pattern of the third semiconductor layer 150.

Figure 4A:
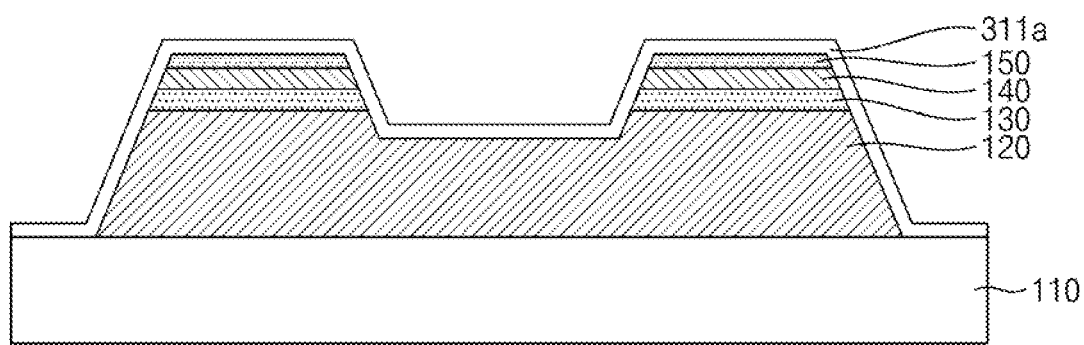

Referring to FIG. 4A, in an embodiment, a transparent electrode material 311*a* may be formed on the substrate 110, the first semiconductor layer 120, each pattern of the active layer 130, each pattern of the second semiconductor layer 140, and each pattern of the third semiconductor layer 150. In an embodiment, the transparent electrode material 311*a* may be formed through a deposition process or the like. For example, the transparent electrode material 311*a* may include the same material as the transparent electrode layer 311 described in reference to FIG. 1.

Figure 4B:
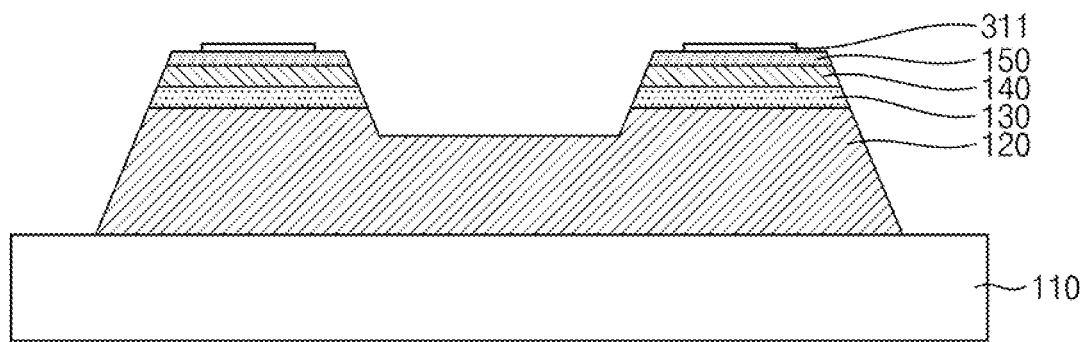

Referring to FIG. 4B, the transparent electrode material 311*a* may be removed at a portion thereof. As the transparent electrode material 311*a* is removed at the portion thereof, the transparent electrode material 311*a* may become each pattern of the transparent electrode layer 311. For example, the portion of the transparent electrode material 311*a* may be removed through dry etching or wet etching.

Figure 5A:
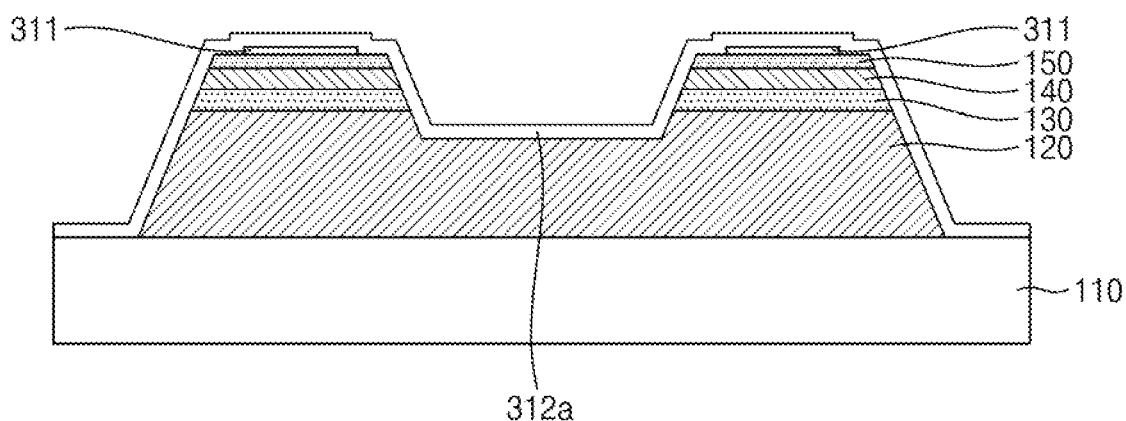

Referring to FIG. 5A, in an embodiment, a bonding electrode material 312*a* may be formed on the substrate 110, the first semiconductor layer 120, each pattern of the active layer 130, each pattern of the second semiconductor layer 140, each pattern of the third semiconductor layer 150, and each pattern of the transparent electrode layer 311. In an embodiment, the bonding electrode material 312*a* may be formed through a deposition process or the like. For example, the bonding electrode material 312*a* may include the same material as the bonding electrode layer 312 described in reference to FIG. 1.

Figure 5B:
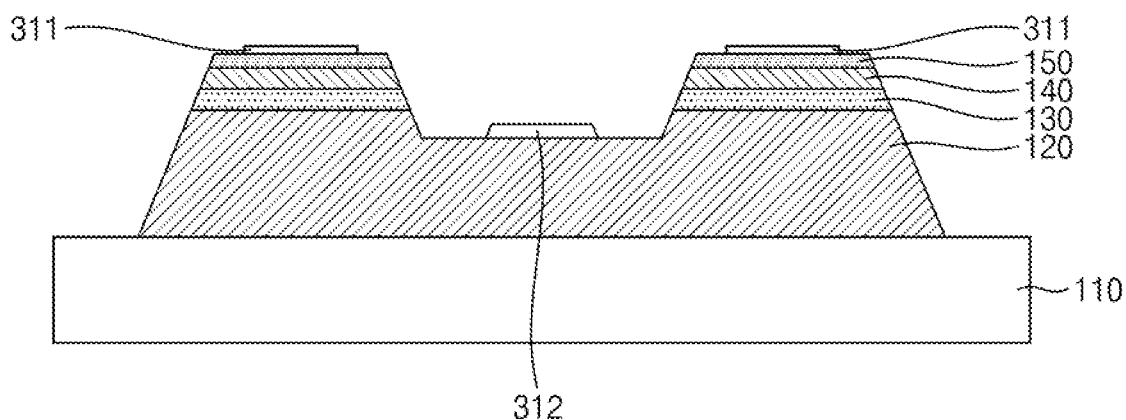

Referring to FIG. 5B, the bonding electrode material 312*a* may be removed at a portion thereof. As the bonding electrode material 312*a* is removed at the portion thereof, the bonding electrode material 312*a* may become each pattern of the bonding electrode layer 312. For example, the portion of the bonding electrode material 312*a* may be removed through dry etching or wet etching.

Although the transparent electrode layer 311 has been described as being first formed and the bonding electrode layer 312 has been described as being then formed through operations shown in FIGS. 5A, 5B, 6A and 6B in this embodiment, the embodiments of the disclosure are not limited thereto. In accordance with embodiments, the bonding electrode layer 312 may first be formed, and the transparent electrode layer 311 may then be formed.

Figure 6A:
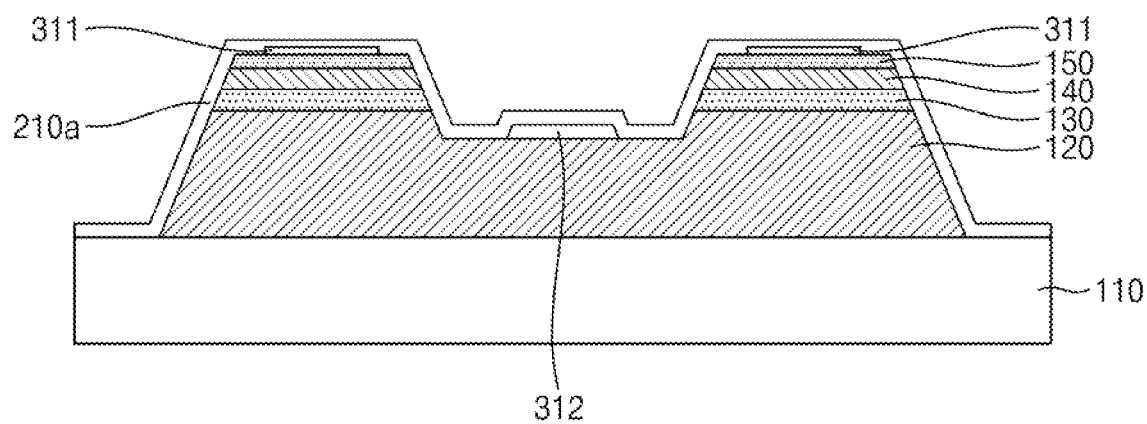

Referring to FIG. 6A, a first insulating material 210*a* may be formed on the substrate 110, the first semiconductor layer 120, each pattern of the active layer 130, each pattern of the second semiconductor layer 140, each pattern of the third semiconductor layer 150, each pattern of the transparent electrode layer 311, and each pattern of the bonding electrode layer 312. In an embodiment, the first insulating material 210*a* may be formed through a deposition process or the like. For example, the first insulating material 210*a* may include the same material as the first insulating layer 210 described in reference to FIG. 1.

Figure 6B:
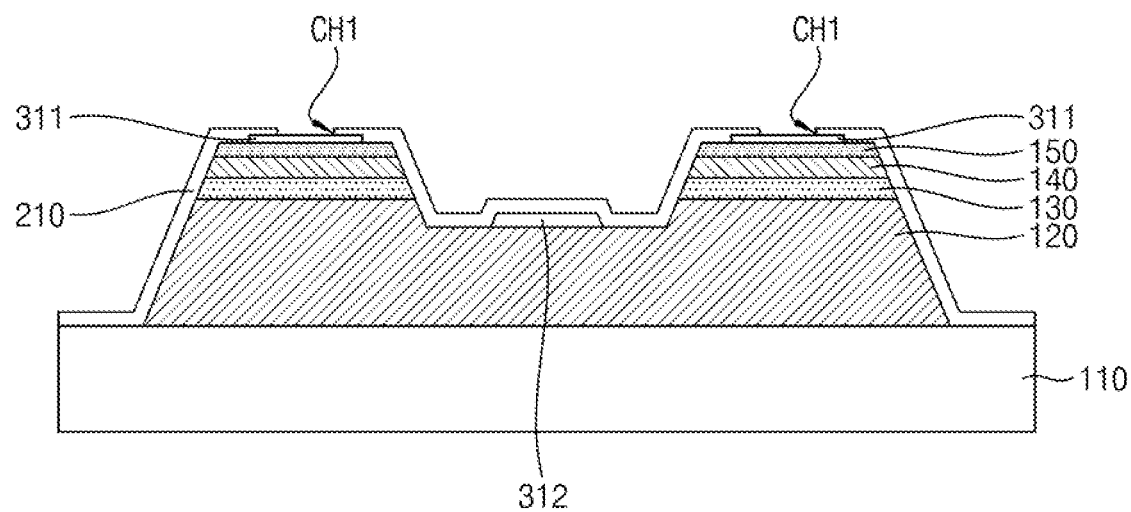

Referring to FIG. 6B, the first insulating material 210*a* may be removed at a portion thereof. As the first insulating material 210*a* is removed at the portion thereof, the first insulating material 210*a* may become the first insulating layer 210. For example, the portion of the first insulating material 210*a* may be removed through dry etching or wet etching. As the portion of the first insulating material 210*a* is removed, an upper portion of each pattern of the transparent electrode layer 311 may be exposed. The removed portion of the first insulating material 210*a* may constitute the first contact hole CH1 described in reference to FIG. 1.

Figure 7A:
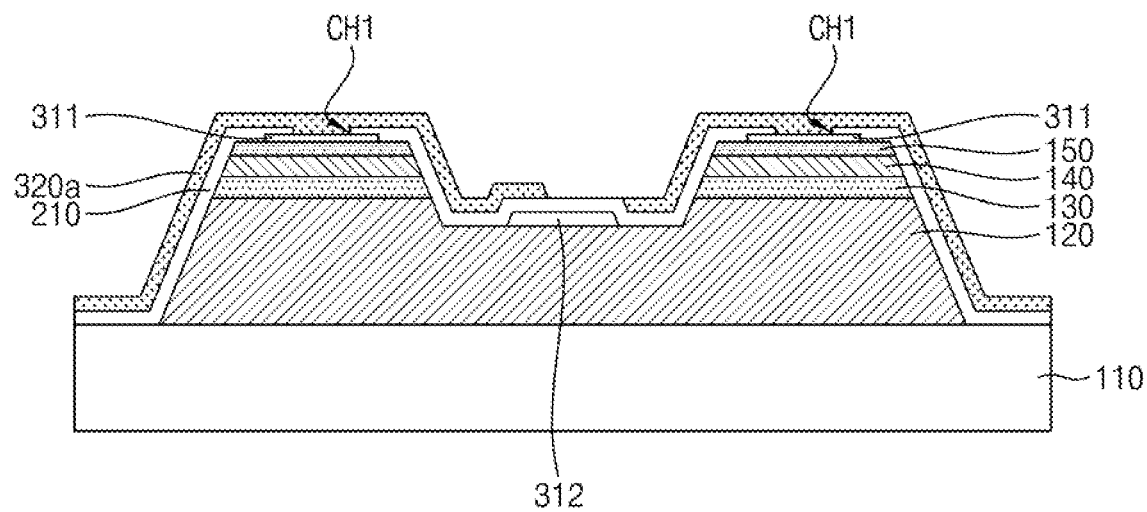

Referring to FIG. 7A, a reflective electrode material 320*a* may be formed on the first insulating layer 210 and to fill the first contact hole CH1. In an embodiment, the reflective electrode material 320*a* may be formed through a deposition process or the like. For example, the reflective electrode material 320*a* may include the same material as the reflective electrode layer 320 described in reference to FIG. 1. The reflective electrode material 320*a* may contact each pattern of the transparent electrode layer 311 through the first contact hole CH1. In an embodiment, the reflective electrode material 320*a* may be formed on a region around the first contact hole CH1, the above-described first inclined surface INC1 and the above-described second inclined surface INC2.

Figure 7B:
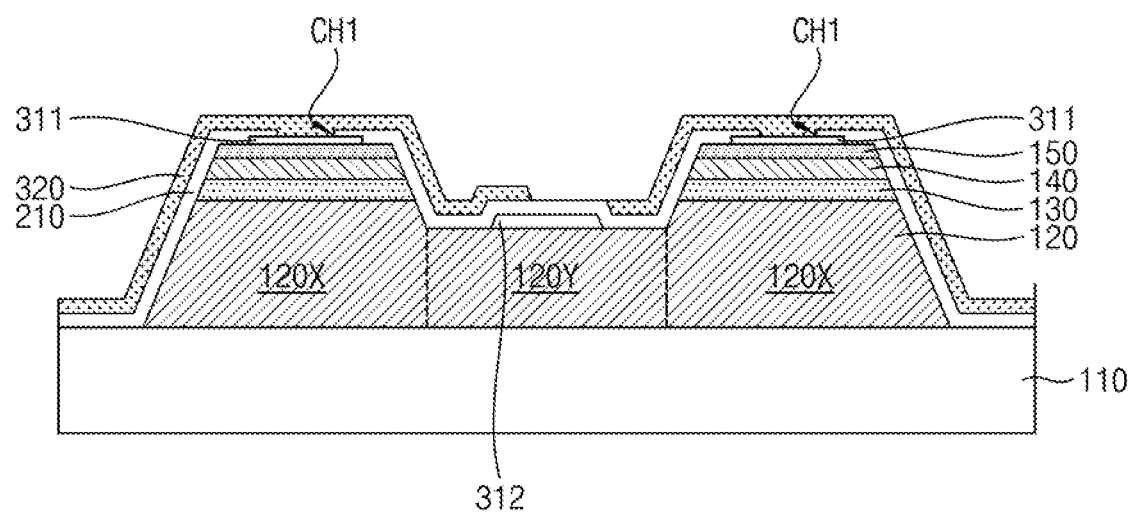

Referring to FIG. 7B, the reflective electrode material 320*a* may be removed at a portion thereof. As the reflective electrode material 320*a* is removed at the portion thereof, the reflective electrode material 320*a* may become each pattern of the reflective electrode layer 320. For example, the portion of the reflective electrode material 320*a* may be removed through dry etching or wet etching. In an embodiment, the reflective electrode material 320*a* may be removed at a portion thereof overlapping the second region 120Y of the first semiconductor layer 120. As the portion of the reflective electrode material 320*a* is removed, a portion of the first insulating layer 210 may be exposed. Each pattern of the reflective electrode layer 320 may be electrically isolated.

Figure 8A:
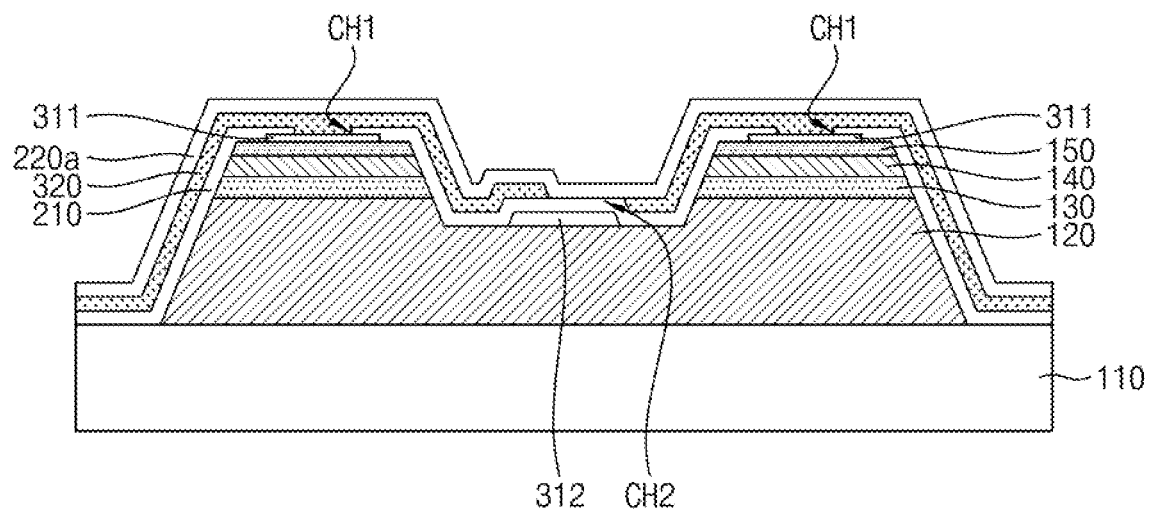

Referring to FIG. 8A, a second insulating material 220*a* may be formed on the patterns of the reflective electrode layer 320 and an exposed portion of the first insulating layer 210 between the patterns of the reflective electrode layer 320. In an embodiment, the second insulating material 220*a* may be formed through a deposition process or the like. For example, the second insulating material 220a may include the same material as the second insulating layer 220 described in reference to FIG. 1.

Figure 8B:
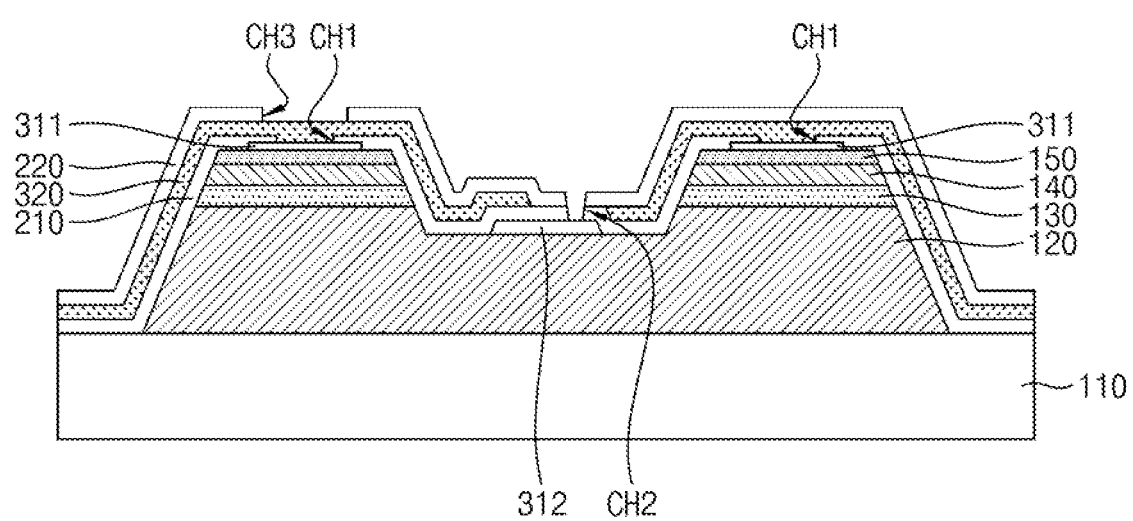

Referring to FIG. 8B, the second insulating material 220a may be removed at a portion thereof. As the second insulating material 220a is removed at the portion thereof, the second insulating material 220a may become the second insulating layer 220. For example, the portion of the second insulating material 220a may be removed through dry etching or wet etching.

As the portion of the second insulating material 220a is removed, an upper portion of each pattern of the reflective electrode layer 320 may be exposed. The portion of the second insulating material 220a removed to expose the upper portion of each pattern of the reflective electrode layer 320 may constitute the third contact hole CH3 described in reference to FIG. 1.

In addition, as another portion of the second insulating material 220a and a portion of the first insulating layer 210 overlapping the other portion are removed, an upper portion of each pattern of the bonding electrode layer 312 may be exposed. The other portion of the second insulating material 220a and the portion of the first insulating layer 210, which are removed to expose the upper portion of each pattern of the bonding electrode layer 312, may constitute the second contact hole CH2 described in reference to FIG. 1.

In an embodiment, the second contact hole CH2 and the third contact hole CH3 may be formed at different times, respectively. For example, the third contact hole CH3 may be formed after formation of the second contact hole CH2, or the second contact hole CH2 may be formed after formation of the third contact hole CH3.

Figure 9:
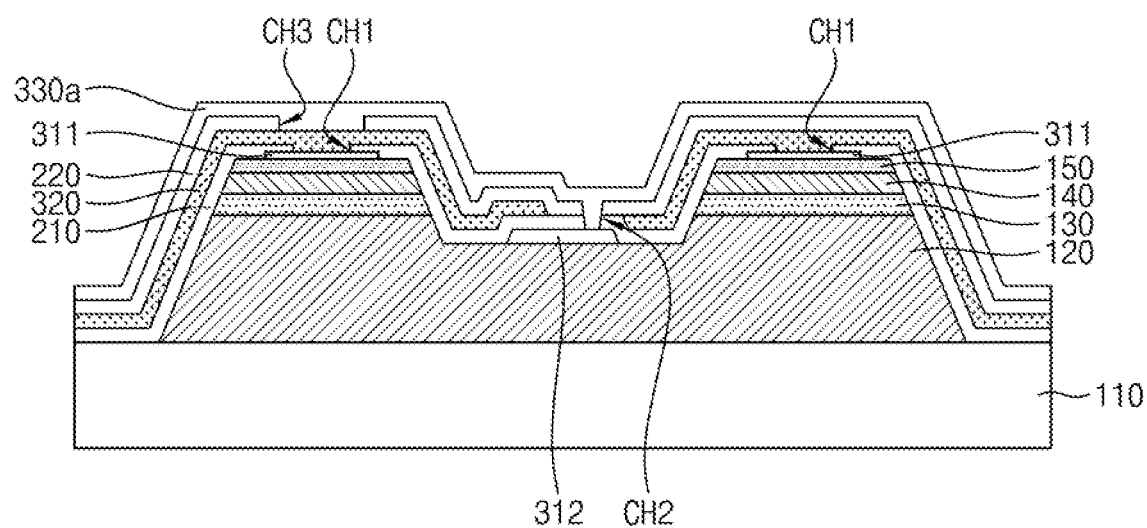

Referring to FIG. 9, a pad electrode material 330a may be formed on the second insulating layer 220 and to fill the second contact hole CH2 and the third contact hole CH3. In an embodiment, the pad electrode material 220a may be formed through a deposition process or the like. For example, the pad electrode material 330a may include the same material as the pad electrode layer 330 described in reference to FIG. 1. The pad electrode material 330a may contact a part of the patterns of the reflective electrode layer 320 and each pattern of the bonding electrode layer 312 through the second contact hole CH2 and the third contact hole CH3.

Although not clearly shown, each pattern of the pad electrode layer 330 may be formed as a portion of the pad electrode material 330a is removed in FIG. 9 so that the semiconductor device package shown in FIG. 1 is formed.

Next, a semiconductor light emitting device package according to another embodiment of the disclosure will be described. In the following description, no description will be given of the same constituent elements as those of FIG. 1, and identical or similar reference numerals designate the same constituent elements.

Figure 10:
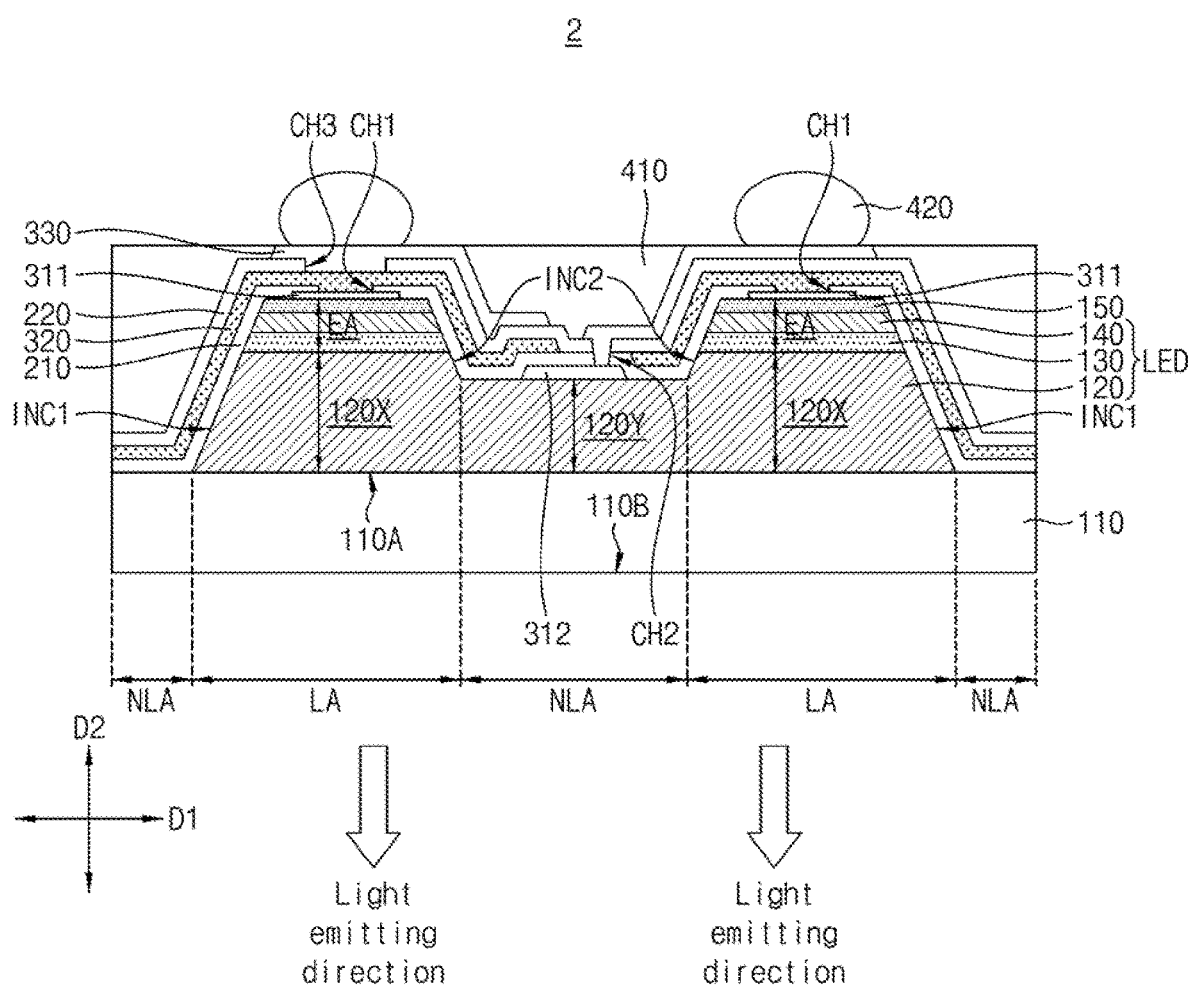
FIG. 10 is a view showing a semiconductor light emitting device package according to an embodiment of the disclosure.

FIG. 10 is a view showing a semiconductor light emitting device package according to an embodiment of the disclosure.

Referring to FIG. 10, a semiconductor light emitting device package 2 according to this embodiment differs from the semiconductor light emitting device package 1 according to the embodiment of FIG. 1 in that the semiconductor light emitting device package 2 further includes a molding layer 410 and connecting terminals 420.

In an embodiment, the molding layer 410 may be disposed on a second insulating layer 220 and a portion of a pad electrode layer 330. The molding layer 410 may be formed on the entirety of a first surface 110A of a substrate 110. The molding layer 410 may expose the other portion of the pad electrode layer 330. The molding layer 410 may fill a groove (concave) region formed by a first inclined surface INC1 and a second inclined surface INC2. That is, the volume of the molding layer 410 disposed to overlap a non-light-emitting area NLA may be greater than the volume of the molding layer 410 disposed to overlap the light-emitting area LA. An upper surface UA of the molding layer 410 may be flat.

For example, the molding layer 410 may include a molding material. For example, the molding material may include an epoxy molding compound (EMC) or two or more kinds of silicon hybrid materials.

The connecting terminals 420 may be disposed on portions of the pad electrode layer 330 exposed by the molding layer 410, respectively. For example, the connecting terminals 420 may be embodied to have the form of a solder ball, a conductive bump, or a flip-chip having a grid array such as pin grid array, a ball grid array, or a land grid array.

Electrical signals having different voltages may be externally applied to the connecting terminals 420, respectively. A part of the connecting terminals 420 may be electrically connected to a part of patterns of the pad electrode layer 330, a part of patterns of a reflective electrode layer 320, and a part of patterns of a transparent electrode layer 311. In addition, the other part of the connecting terminals 420 may be electrically connected to a part of patterns of the pad electrode layer 330 and a part of patterns of a bonding electrode layer 312. In accordance with embodiments, an electrical signal having a lower voltage than an electrical signal externally applied to the connecting terminal 420 electrically connected to the part of the patterns the transparent electrode layer 311 may be externally applied to the connecting terminal 420 electrically connected to the part of the patterns the bonding electrode layer 312.

Figure 11:
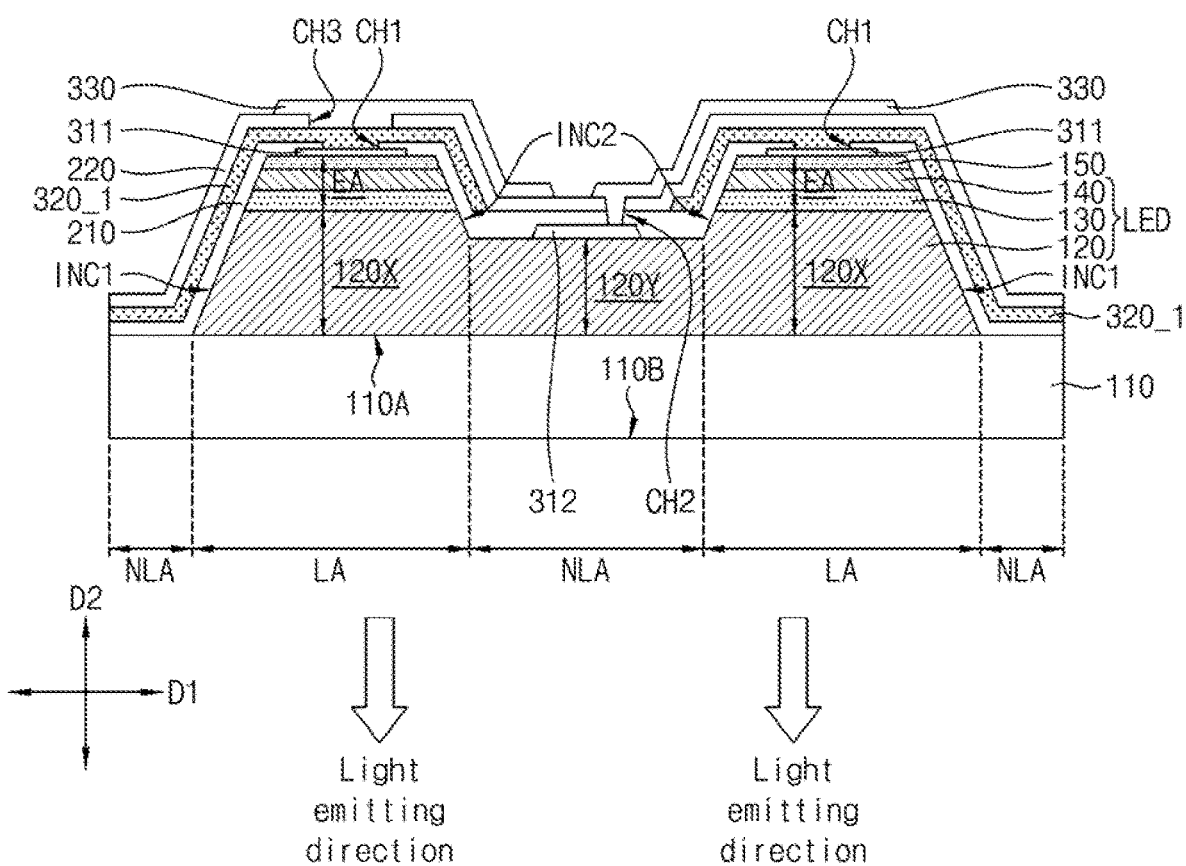
FIG. 11 is a view showing a semiconductor light emitting device package according to an embodiment of the disclosure.

FIG. 11 is a view showing a semiconductor light emitting device package according to an embodiment of the disclosure.

Referring to FIG. 11, a semiconductor light emitting device package 3 according to this embodiment differs from the semiconductor light emitting device package 1 according to the embodiment of FIG. 1 in that each pattern of a reflective electrode layer 320_1 does not overlap each pattern of a bonding electrode layer 312.

In an embodiment, each pattern of the reflective electrode layer 320_1 may not overlap each pattern of the bonding electrode layer 312 in a second direction D2. For example, each pattern of the reflective electrode layer 320_1 may overlap a second region 120Y in the second direction D2 in a small region around a boundary between a first region 120X and the second region 120Y.

Although not clearly shown, in accordance with embodiments, each pattern of the reflective electrode layer 320_1 may extend from a portion thereof contacting a transparent electrode layer 311 only to a second inclined surface INC2. In this case, an end of each pattern of the reflective electrode layer 320_1 on the second inclined surface INC2 may be disposed at a lower position than a position where the active layer 130 is formed.

Figure 12:
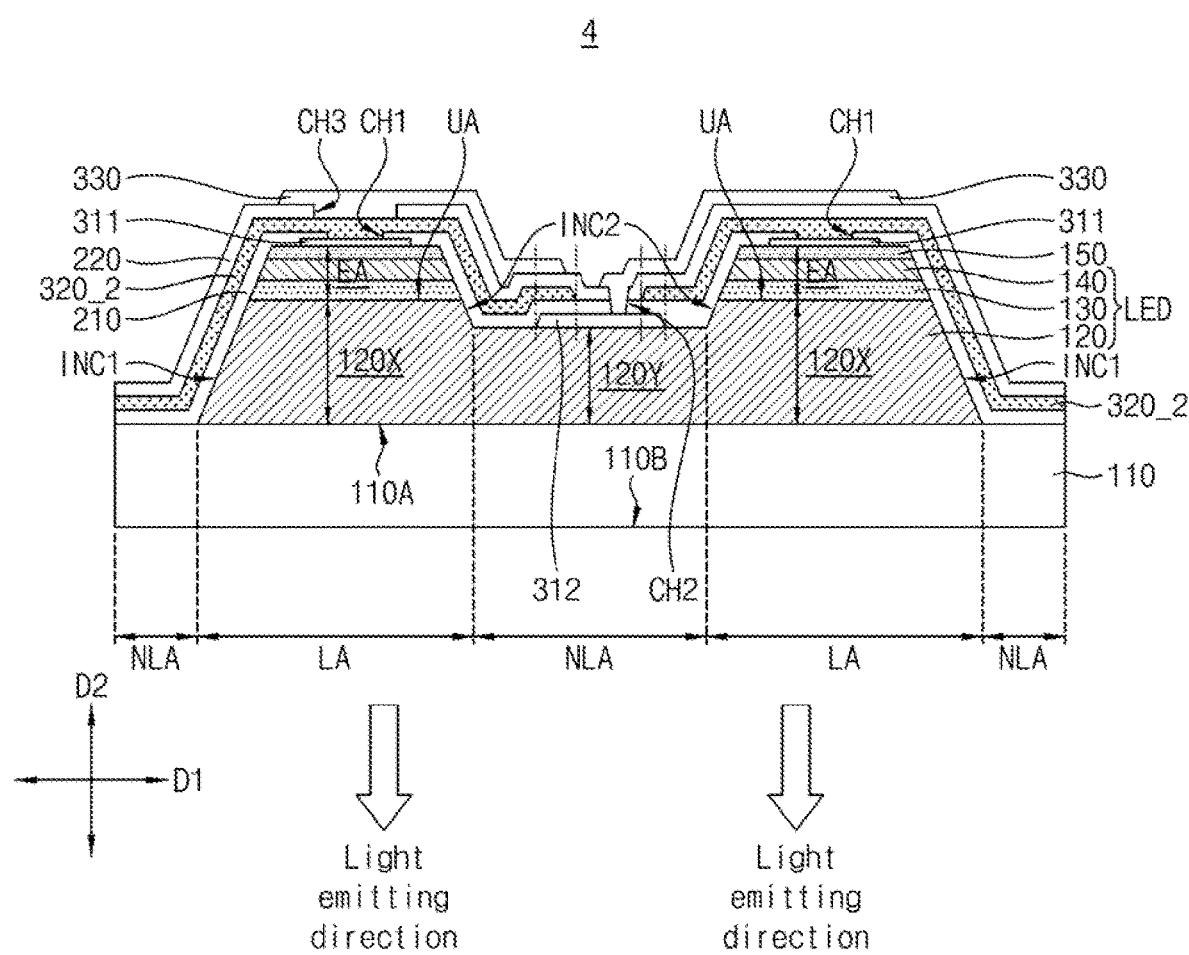
FIG. 12 is a view showing a semiconductor light emitting device package according to an embodiment of the disclosure.

FIG. 12 is a view showing a semiconductor light emitting device package according to an embodiment of the disclosure.

Referring to FIG. 12, a semiconductor light emitting device package 4 according to this embodiment differs from the semiconductor light emitting device package 1 according to the embodiment of FIG. 1 in that all patterns of a reflective electrode layer 320_2 include portions overlapping patterns of a bonding electrode layer 312, respectively.

In an embodiment, all patterns of the reflective electrode layer 320_2 may include portions overlapping the patterns of the bonding electrode layer 312 in a second direction D2, respectively. For example, each pattern of the reflective electrode layer 320_2 may extend in a first direction D1 to overlap each pattern of the bonding electrode layer 312 in the second direction D2. Each pattern of the reflective electrode layer 320_2 may be formed over the majority of a second region 120Y of a first semiconductor layer 120, except for a region in which a second contact hole CH2 is formed and a region therearound.

Figure 13:
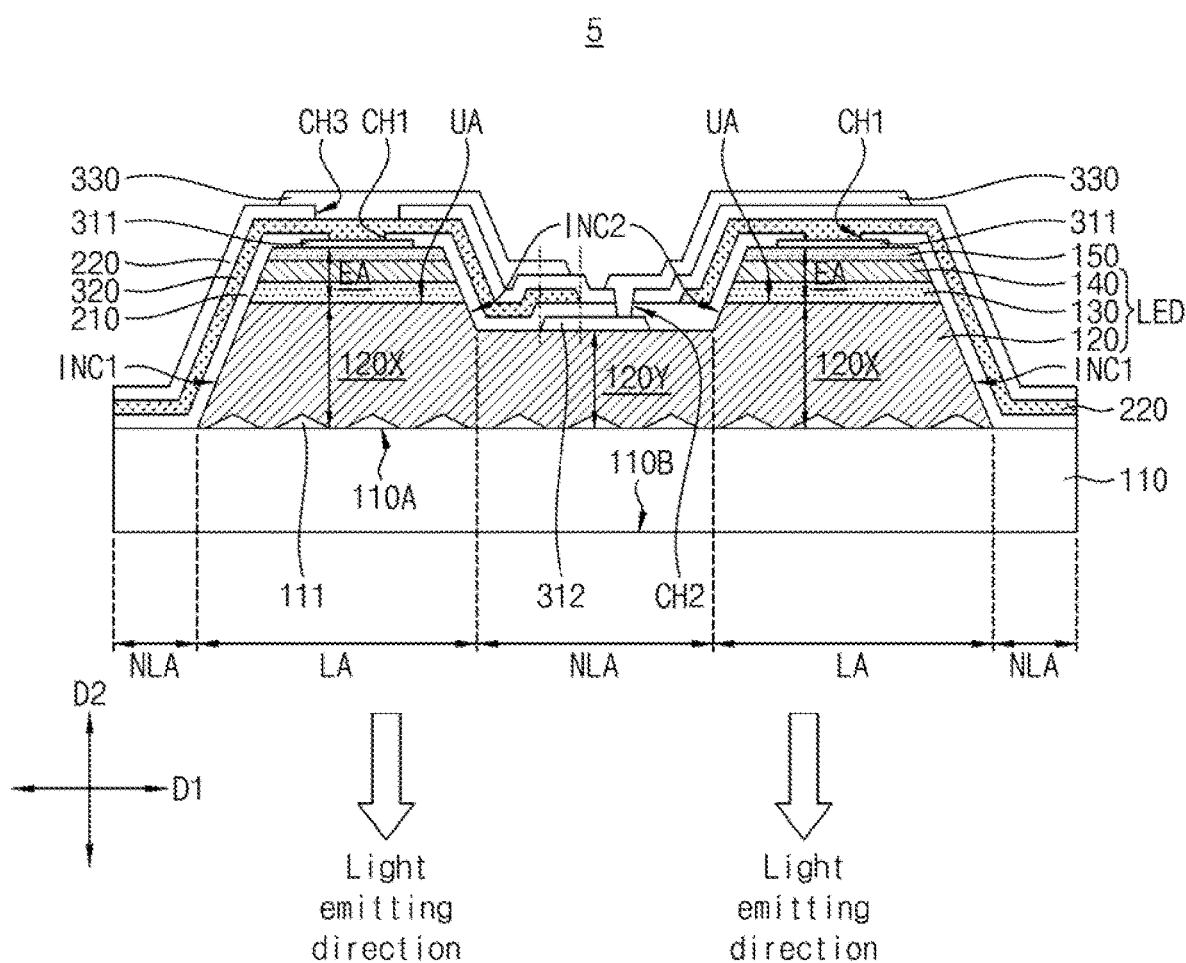
FIG. 13 is a view showing a semiconductor light emitting device package according to an embodiment of the disclosure.

FIG. 13 is a view showing a semiconductor light emitting device package according to an embodiment of the disclosure.

Referring to FIG. 13, a semiconductor light emitting device package 5 according to this embodiment differs from the semiconductor light emitting device package 1 according to the embodiment of FIG. 1 in that a protrusion pattern 111 is formed on a first surface 110A of a substrate 110.

In an embodiment, the protrusion pattern 111 may be formed on the first surface 110A of the substrate 110. Accordingly, the protrusion pattern 111 may be a part of the substrate 110. For example, the protrusion pattern 111 may be a diffraction grating. The protrusion pattern 111 may include function to reduce a phenomenon in which light emitted from an active layer 130 is again totally reflected toward a light emitting device LED.

Although the shape of the protrusion pattern 111 is shown as being a triangular shape when viewed in cross-section, the embodiments of the disclosure are not limited thereto.

In accordance with the embodiments of the disclosure, it may be possible to minimize a light loss rate of a semiconductor light emitting device package.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor light emitting device package comprising:
   a substrate;
   a first semiconductor layer comprising first regions comprising a first material as a first- type semiconductor material and having a first height, and a second region disposed between the first regions and having a second height lower than the first height;
   an active layer comprising a plurality of patterns disposed in the first regions of the first semiconductor layer, respectively, wherein the plurality of patterns of the active layer are configured to emit light of a predetermined wavelength band;
   a second semiconductor layer comprising a plurality of patterns disposed on the plurality of patterns of the active layer, respectively, and formed of a second material as a second-type semiconductor material;
   a third semiconductor layer comprising a plurality of patterns disposed on the plurality of patterns of the second semiconductor layer, respectively, and formed of a third material different from the second material of the second semiconductor layer;
   a transparent electrode layer comprising a plurality of patterns disposed on the plurality of patterns of the third semiconductor layer, respectively; and
   a reflective electrode layer comprising a plurality of patterns electrically connected to the plurality of patterns of the transparent electrode layer, respectively, and comprising a first portion disposed on an upper portion of the transparent electrode layer and a side portion of the active layer and contacting the upper portion of the transparent electrode layer and a second portion extending from the first portion and overlapping a part of the second region of the first semiconductor layer in a vertical direction.

2. The semiconductor light emitting device package according to claim 1, wherein each of the first regions comprises:
   a first inclined surface;
   a second inclined surface;
   an upper surface formed between the first inclined surface and the second inclined surface, and
   wherein a pattern of the reflective electrode layer is disposed on the first inclined surface, the second inclined surface and the upper surface.

3. The semiconductor light emitting device package according to claim 2, wherein:
   an end of the first inclined surface contacts the substrate;
   an end of the second inclined surface contacts the second region; and
   a length of the first inclined surface is greater than a length of the second inclined surface.

4. The semiconductor light emitting device package according to claim 2, further comprising a bonding electrode layer disposed in the second region of the first semiconductor layer.

5. The semiconductor light emitting device package according to claim 4, wherein the pattern of the reflective electrode layer comprises a portion overlapping the bonding electrode layer in the vertical direction.

6. The semiconductor light emitting device package according to claim 2, wherein the pattern of the reflective electrode layer comprises a portion overlapping the second region in the vertical direction.

7. The semiconductor light emitting device package according to claim 2, wherein each pattern of the active layer, each pattern of the second semiconductor layer, each pattern of the third semiconductor layer, and each pattern of the transparent electrode layer are sequentially disposed in each of the first regions.

8. The semiconductor light emitting device package according to claim 1, further comprising an insulating layer disposed on the first semiconductor layer, the active layer, the second semiconductor layer, the third semiconductor layer, and the transparent electrode layer,
   wherein the insulating layer comprises a contact hole exposing at least a portion of the transparent electrode layer, and
   wherein each pattern of the reflective electrode layer contacts each pattern of the transparent electrode layer through the contact hole.

9. The semiconductor light emitting device package according to claim 1, wherein, in each of the first regions, a length of a pattern of the first semiconductor layer is greater than a length of a pattern of the active layer, which is greater than a length of a pattern of the second semiconductor layer, which is greater than a length of a pattern of the third semiconductor layer, in a horizontal direction, so that side surfaces of the patterns of the first semiconductor layer, the active layer, the second semiconductor layer and the third semiconductor layer form inclined surfaces, respectively, and wherein patterns of the reflective electrode layer are disposed on the inclined surfaces.

10. The semiconductor light emitting device package according to claim 9, wherein the active layer is disposed at a higher position than the second region of the first semiconductor layer without overlapping the second region in the vertical direction.

11. The semiconductor light emitting device package according to claim 1, wherein:
the transparent electrode layer comprises ITO; and
the reflective electrode layer comprises at least one of Ag, Al, Au, and Rh.

12. The semiconductor light emitting device package according to claim 1, wherein:
the first semiconductor layer comprises n-type AlGaN;
the second semiconductor layer comprises p-type AlGaN; and
the third semiconductor layer comprises GaN.

13. A semiconductor light emitting device package comprising:
a substrate comprising a light-emitting area and a non-light-emitting area;
a light emitting device disposed on the substrate, and comprising an anode layer, an active layer, and a cathode layer, wherein the anode layer comprises first regions having a first height, and a second region disposed between the first regions and having a second height smaller than the first height;
a transparent electrode layer electrically connected to the anode layer and disposed on the anode layer; and
a reflective electrode layer electrically connected to the transparent electrode layer, the reflective electrode layer comprising:
a first portion disposed on an upper portion of the transparent electrode layer and a side portion of the active layer and contact the upper portion of the transparent electrode layer,
a second portion disposed in the non-light-emitting area in which the light emitting device is not disposed, and
a third portion disposed on the second region of the anode layer.

14. The semiconductor light emitting device package according to claim 13, wherein a length of the anode layer is greater than a length of the active layer, which is greater than a length of the cathode layer, so that side surfaces of the anode layer, the active layer and the cathode layer form inclined surfaces, and
wherein a portion of the reflective electrode layer is disposed on the inclined surfaces.

15. The semiconductor light emitting device package according to claim 13, wherein:
each of the first regions overlaps the light-emitting area;
the second region overlaps the non-light-emitting area;
the active layer and the cathode layer are disposed in the first regions without being disposed in the second region; and
the reflective electrode layer comprises a portion overlapping the first region in a vertical direction, and a portion overlapping the second region in the vertical direction.

16. The semiconductor light emitting device package according to claim 15, wherein:
the first region comprises an inclined surface at a portion thereof adjacent to the second region; and
the reflective electrode layer comprises a portion formed on the inclined surface.

17. The semiconductor light emitting device package according to claim 16, further comprising:
a bonding electrode layer disposed in the second region of the anode layer,
wherein the reflective electrode layer comprises a portion overlapping the bonding electrode layer in the vertical direction.

18. The semiconductor light emitting device package according to claim 13, wherein:
an end of the reflective electrode layer is aligned with an end of the substrate in a vertical direction; and
the end of the substrate is included in the non-light-emitting area.

19. A semiconductor light emitting device package comprising:
a substrate;
a first semiconductor layer disposed on the substrate, and formed of a first-type semiconductor material, the first semiconductor layer comprising first regions having a first height, and a second region disposed between the first regions and having a second height smaller than the first height;
an active layer comprising patterns disposed on the first regions of the first semiconductor layer, respectively, the patterns configured to emit light of a predetermined wavelength band;
a second semiconductor layer comprising a plurality of patterns disposed on the patterns of the active layer, respectively, and formed of a second-type semiconductor material;
a third semiconductor layer comprising a plurality of patterns disposed on the patterns of the second semiconductor layer, respectively, and formed of a second-type semiconductor material different from the second-type semiconductor material of the second semiconductor layer;
a transparent electrode layer comprising a plurality of patterns disposed on the patterns of the third semiconductor layer, respectively;
a bonding electrode layer disposed on the second region of the first semiconductor layer;
a first insulating layer disposed on the transparent electrode layer and the bonding electrode layer and comprising a first contact hole exposing at least a part of an upper surface of the transparent electrode layer and a second contact hole exposing at least a part of an upper surface of the bonding electrode layer;
a reflective electrode layer disposed on the first insulating layer, and comprising a plurality of patterns contacting the patterns of the transparent electrode layer through the first contact hole, respectively;
a second insulating layer disposed on the reflective electrode layer and the first contact hole of the first insulating layer and comprising a third contact hole exposing at least a part of an upper surface of the reflective electrode layer and a fourth contact hole overlapping the second contact hole in a vertical direction; and
a pad electrode layer disposed on the second insulating layer, the pad electrode layer comprising a first pattern contacting a part of the patterns of the reflective electrode layer through the third contact hole, and a second pattern contacting the bonding electrode layer through the second contact hole of the first insulating layer and the fourth contact hole of the second insulating layer,
wherein each of the first regions comprises a first inclined surface formed at one side portion of the first region connected to the substrate, a second inclined surface formed at the other side portion of the first region connected to the second region, and an upper surface disposed between the first inclined surface and the second inclined surface, and wherein a part of the patterns of the reflective electrode layer is formed to extend along the first inclined surface, the second inclined surface and the upper surface to a region where the first semiconductor layer is not disposed.

20. The semiconductor light emitting device package according to claim 19, further comprising:

a molding layer formed on the second insulating layer and the pad electrode layer, and exposing a portion of the pad electrode layer; and connecting terminals disposed on the exposed portion of the pad electrode layer.

* * * * *